United States Patent
Carey et al.

(10) Patent No.: US 8,014,109 B2
(45) Date of Patent: Sep. 6, 2011

(54) CURRENT-PERPENDICULAR-TO-THE-PLANE (CPP) MAGNETORESISTIVE SENSOR WITH ANTIPARALLEL-PINNED LAYER CONTAINING SILICON

(75) Inventors: Matthew J. Carey, San Jose, CA (US); Jeffrey R. Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1000 days.

(21) Appl. No.: 11/867,063

(22) Filed: Oct. 4, 2007

(65) Prior Publication Data

US 2009/0091864 A1    Apr. 9, 2009

(51) Int. Cl.
*G11B 5/33* (2006.01)
(52) U.S. Cl. ............ 360/324.1; 360/324.11; 360/324.12
(58) Field of Classification Search ........... 360/324.1, 360/324.11–324.12
See application file for complete search history.

(56) References Cited

U.S. PATENT DOCUMENTS

| | | | | |
|---|---|---|---|---|
| 5,869,963 | A * | 2/1999 | Saito et al. | 324/252 |
| 6,905,780 | B2 * | 6/2005 | Yuasa et al. | 428/611 |
| 7,079,361 | B2 | 7/2006 | Sugita et al. | |
| 2001/0013999 | A1 * | 8/2001 | Koi et al. | 360/324.11 |
| 2004/0257719 | A1 * | 12/2004 | Ohba et al. | 360/324.2 |
| 2005/0073778 | A1 | 4/2005 | Hasegawa et al. | |
| 2005/0074634 | A1 | 4/2005 | Hasegawa et al. | |
| 2006/0044705 | A1 * | 3/2006 | Hasegawa et al. | 360/324.11 |
| 2006/0067017 | A1 | 3/2006 | Yuasa et al. | |

* cited by examiner

*Primary Examiner* — Daniell L Negron
*Assistant Examiner* — Carlos E Garcia
(74) *Attorney, Agent, or Firm* — Thomas R. Berthold

(57) ABSTRACT

A current-perpendicular-to-the-plane (CPP) spin-valve (SV) magnetoresistive sensor uses an antiparallel (AP) pinned structure and has a ferromagnetic alloy comprising Co, Fe and Si in the reference layer of the AP-pinned structure and optionally in the CPP-SV sensor's free layer. The reference layer or AP2 layer is a multilayer of a first AP2-1 sublayer that contains no Si and is in contact with the AP-pinned structure's antiparallel coupling (APC) layer, and a second AP2-2 sublayer that contains Si and is in contact with the CPP-SV sensor's spacer layer. The Si-containing alloy may consist essentially of only Co, Fe and Si according to the formula $(Co_xFe_{(100-x)})_{(100-y)}Si_y$, where the subscripts represent atomic percent, x is between about 45 and 55, and y is between about 20 and 30.

16 Claims, 4 Drawing Sheets

CURRENT-PERPENDICULAR-TO-THE-PLANE (CPP) MAGNETORESISTIVE SENSOR WITH ANTIPARALLEL-PINNED LAYER CONTAINING SILICON

BACKGROUND OF THE INVENTION

1. Field of the Invention

The invention relates generally to a current-perpendicular-to-the-plane (CPP) magnetoresistive sensor that operates with the sense current directed perpendicularly to the planes of the layers making up the sensor stack, and more particularly to a CPP sensor with improved ferromagnetic layers.

2. Background of the Invention

One type of conventional magnetoresistive sensor used as the read head in magnetic recording disk drives is a "spin-valve" (SV) sensor. A SV magnetoresistive sensor has a stack of layers that includes two ferromagnetic layers separated by a nonmagnetic electrically conductive spacer layer, which is typically copper (Cu). One ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance.

In a magnetic recording disk drive SV read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. If the sense current flowing through the SV is directed parallel to the planes of the layers in the sensor stack, the sensor is referred to as a current-in-the-plane (CIP) sensor, while if the sense current is directed perpendicular to the planes of the layers in the sensor stack, it is referred to as current-perpendicular-to-the-plane (CPP) sensor. CPP-SV read heads are described by A. Tanaka et al., "Spin-valve heads in the current-perpendicular-to-plane mode for ultra-high-density recording", *IEEE TRANSACTIONS ON MAGNETICS*, 38 (1): 84-88 Part 1 January 2002.

The fixed or pinned ferromagnetic layer in a CPP-SV sensor used in read heads may be an antiparallel (AP) pinned structure. The AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's spacer layer on the other side, is typically referred to as the reference layer. The AP1 layer, which is typically in contact with an antiferromagnetic or hard magnet pinning layer on one side and the nonmagnetic APC layer on the other side, is typically referred to as the pinned layer. If the AP-pinned structure is the "self-pinned" type, then no pinning layer is required. In a self-pinned structure where no antiferromagnet or hard magnet pinning layer is present, the AP1 layer is in contact with a seed layer on the sensor substrate. The AP-pinned structure minimizes magnetostatic coupling between the reference layer and the CPP-SV free ferromagnetic layer. The AP-pinned structure, also called a "laminated" pinned layer, and sometimes called a synthetic antiferromagnet (SAF), is described in U.S. Pat. No. 5,465,185.

In CPP-SV sensors, because the sense current flows perpendicular to all the layers in the sensor stack, the electrical resistance of the active region (the free layer, spacer layer and the reference layer of the AP-pinned structure) is a relatively small part of the total resistance of the sensor. Antiferromagnetic pinning layers such as PtMn or IrMn do not contribute to the magnetoresistance signal; rather they constitute a parasitic resistance that decreases the overall signal significantly since its magnitude can be similar or greater than the total resistance of the active part of the spin-valve structure. This parasitic resistance is large compared to a typical magnetoresistance resistance-area product ($\Delta RA$) originating from the active region. It is thus desirable to increase the resistance of the active region without significantly increasing the total stack resistance.

The materials making up the free layer and the reference layer in an AP-pinned structure are typically crystalline alloys of CoFe or NiFe. These materials have a relatively low electrical resistivity ($\rho$) and thus do not contribute significantly to the magnetoresistance $\Delta RA$ of the active region. Moreover, it is known that an increase in $\rho$ in the materials making up the free layer and the reference is associated with a shortening of the spin diffusion length (SDL). It is desirable to shorten SDL to the extent that it becomes comparable to the thickness of the magnetic layers in the active region, which means that more of the active region is available for bulk electron scattering. This results in an increase in the magnetoresistance ($\Delta R/R$) of the CPP read head. For example, the SDL for crystalline CoFe alloys is greater than the typical thickness of the AP2 layer, which is about 15-30 Å, so that not all of the thickness of the AP2 layer is being used for bulk electron scattering.

What is needed is a CPP-SV sensor that has an AP-pinned structure and that has improved ferromagnetic materials for the free layer and the reference layer that increase the magnetoresistance of the sensor.

SUMMARY OF THE INVENTION

The invention is a CPP-SV magnetoresistive sensor that uses an AP-pinned structure and that has a ferromagnetic alloy comprising Co, Fe and Si in the reference layer and optionally in the free layer. The reference layer or AP2 layer is a multilayer of a first AP2-1 sublayer that contains no Si and is in contact with the APC layer and a second AP2-2 sublayer that contains Si and is in contact with the spacer layer. The Si-containing alloy may consist essentially of only Co, Fe and Si according to the formula $(Co_xFe_{(100-x)})_{(100-y)}Si_y$ where the subscripts represent atomic percent, x is between about 45 and 55, and y is between about 20 and 30. It has been discovered if Si is present in the AP2 layer, the AP2 layer should be a multilayer so that the first AP2-1 sublayer, which is in contact with the APC layer, contains no Si. In the preferred embodiment both the second AP2-2 sublayer and the free layer are formed of the Si-containing alloy.

The AP-pinned structure may be pinned by an antiferromagnetic layer or hard magnet layer adjacent the AP1 layer. Alternatively, the AP-pinned structure may be a self-pinned structure.

The free layer structure may be a standard free layer structure, or an antiparallel-coupled free (APF) layer of two magnetic layers of unequal magnetization coupled antiparallel to each other via an APC layer. If the free layer is an APF layer, then the first free ferromagnetic layer (APF1) should be a multilayer of a first APF1-1 sublayer containing Si and located adjacent the spacer layer and a second APF1-2 sublayer without Si and located adjacent the APC layer.

The sensor may also be a dual-spin-valve sensor, where two similar AP-pinned structures are arranged symmetrically on either side of a single free layer structure.

For a fuller understanding of the nature and advantages of the present invention, reference should be made to the following detailed description taken together with the accompanying figures.

DETAILED DESCRIPTION OF THE INVENTION

Figure 1:
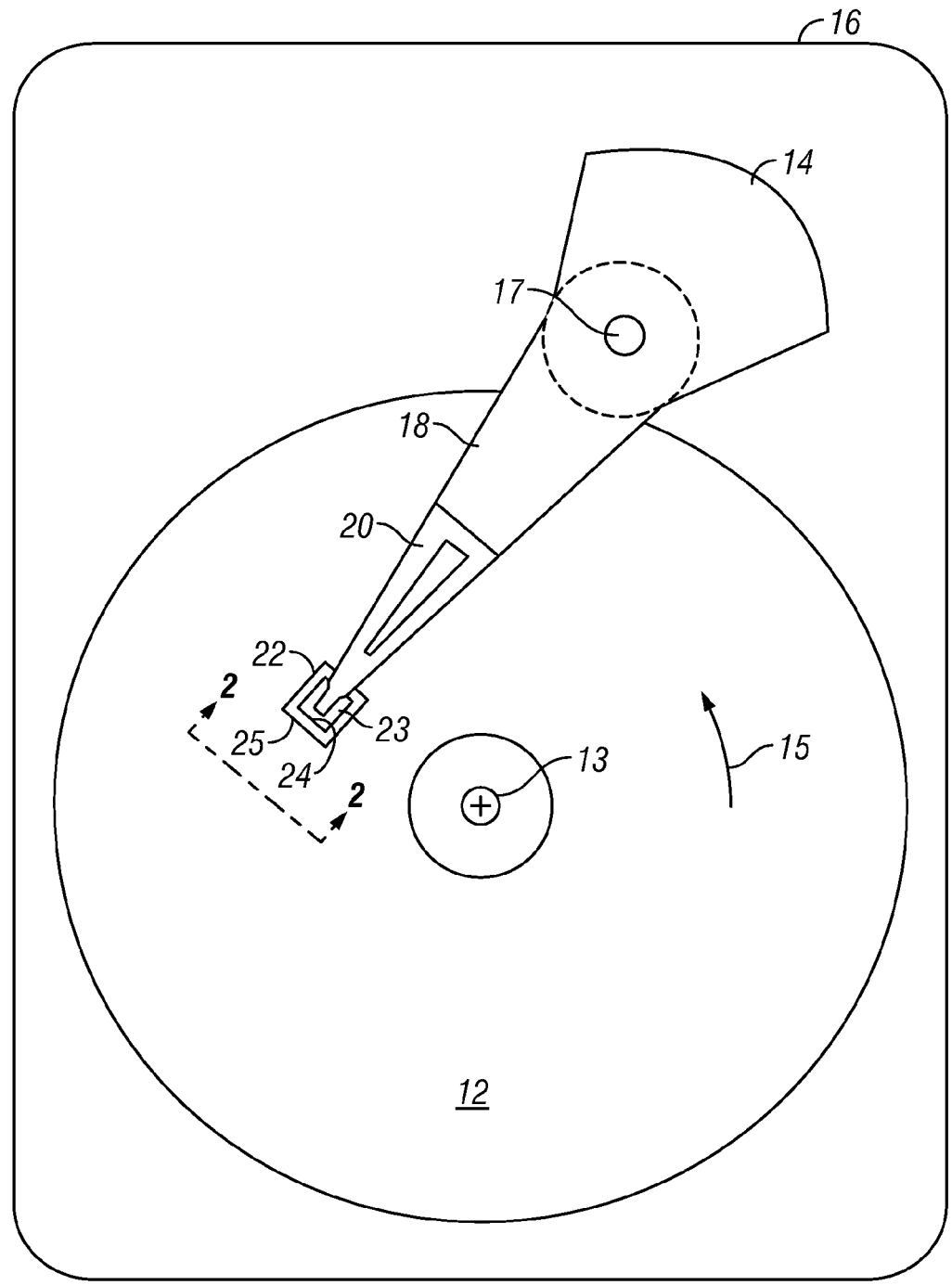
FIG. 1 is a schematic top view of a conventional magnetic recording hard disk drive with the cover removed.

The CPP-SV read head has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
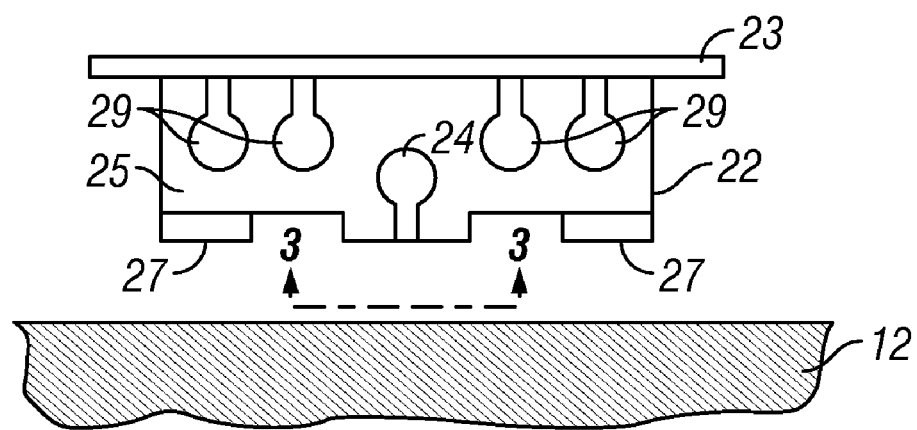
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
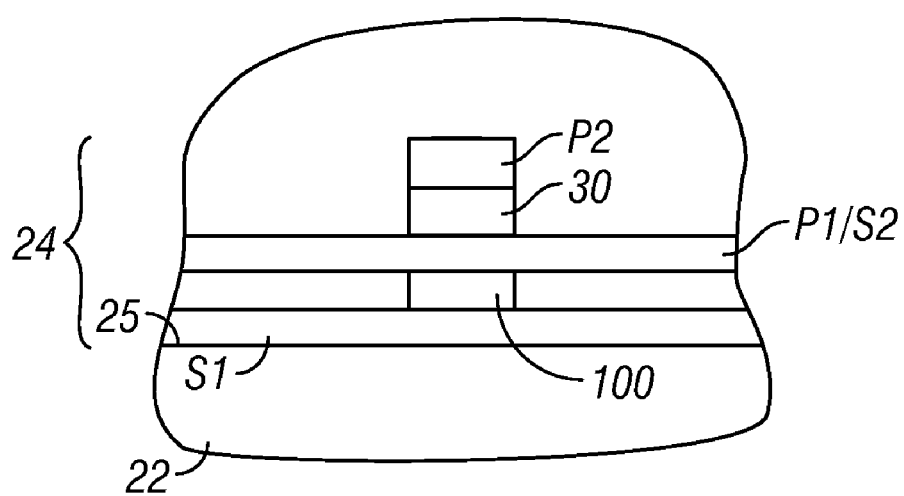
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1/S2 and P1 separated by a write gap 30. The CPP-SV magnetoresistive sensor or read head 100 is located between two magnetic shields S1 and P1/S2, with P1/S2 also serving as the first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, or copper, that are in contact with the shields S1, S2.

Figure 4:
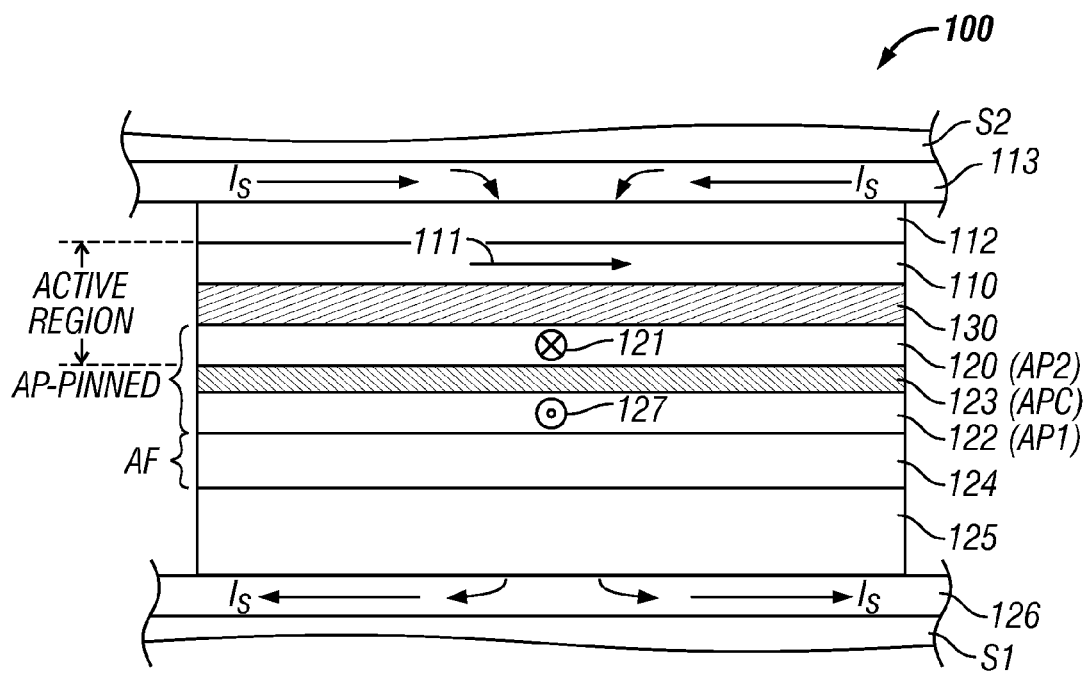
FIG. 4 is a cross-sectional schematic view of a CPP-SV read head showing the stack of layers located between the magnetic shield layers.

FIG. 4 is an enlarged sectional view showing the layers making up sensor 100. Sensor 100 is a CPP-SV read head comprising a stack of layers formed between the two magnetic shield layers S1, S2 that are typically electroplated NiFe alloy films. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and an electrically conducting spacer layer 130, typically copper (Cu), between the reference layer 120 and free layer 110.

The reference layer 120 is part of the well-known antiparallel (AP) pinned structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower ferromagnetic (AP1) layer 122 that are antiferromagnetically coupled across an AP coupling (APC) layer 123, such as Ru, Ir, Rh, or Cr, or alloys thereof. The free ferromagnetic layer 110, spacer layer 130 and AP2 layer 120 together make up what is call the "active region" of the sensor. The AP1 and AP2 ferromagnetic layers have their respective magnetization directions 127, 121 oriented antiparallel. The AP-pinned structure may be "self-pinned" or the AP1 layer 122 may have its magnetization direction pinned by being exchange-coupled to an antiferromagnetic (AF) layer 124 or pinned by a hard magnetic layer such as $Co_{100-x}Pt_x$ or $Co_{100-x-y}Pt_xCr_y$ (where x is between about and 8 and 30 at. %). In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar magnetic moments. This assures that the net magnetic moment of the AP-pinned structure is small so that magneto-static coupling to the free layer is minimized and the effective pinning field of the AF layer 124, which is approximately inversely proportional to the net magnetization of the AP-pinned structure, remains high. In the case of a hard magnetic pinning layer, the hard magnetic pinning layer moment needs to be accounted for when balancing the moments of AP1 and AP2 to minimize magneto-static coupling to the free layer.

Located between the lower shield layer S1 and the AP-pinned structure are the bottom electrical lead 126 and a seed layer 125. The seed layer 125 may be a single layer or multiple layers of different materials. Located between the free ferromagnetic layer 110 and the upper shield layer S2 are a capping layer 112 and the top electrical lead 113. The capping layer 112 may be a single layer or multiple layers of different materials, such as Cu, Ru, Rh or Ta.

In the presence of an external magnetic field in the range of interest, i.e., magnetic fields from recorded data on the disk 12, the magnetization direction 111 of free layer 110 will rotate while the magnetization direction 121 of reference layer 120 will remain fixed and not rotate. Thus when a sense current $I_S$ is applied from top lead 113 perpendicularly through the stack to bottom lead 126, the magnetic fields from the recorded data on the disk will cause rotation of the free-layer magnetization 111 relative to the reference-layer magnetization 121, which is detectable as a change in electrical resistance.

The leads 126, 113 are typically Ta or Rh. However, a lower resistance material may also be used. They are optional and used to adjust the shield-to-shield spacing. If the leads 126 and 113 are not present, the bottom and top shields S1 and S2 are used as leads. The seed layer 125 is typically one or more layers of NiFeCr, NiFe, Ta, Cu or Ru. The AF layer 124 is typically a Mn alloy, e.g., PtMn, NiMn, FeMn, IrMn, PdMn, PtPdMn or RhMn. If a hard magnetic layer is used instead of an AF layer it is typically a CoPt or FePt alloy, for example CoPtCr. The capping layer 112 provides corrosion protection and is typically formed of Ru or Ta.

The ferromagnetic layers 122 (AP1), 120 (AP2), and 110 (free layer) are typically formed of a crystalline alloy such as CoFe or NiFe, or a multilayer of these materials, such as a CoFe/NiFe bilayer. These alloys have a sufficiently high magnetic moment M, a moderate bulk electron scattering parameter β, but a relatively low electrical resistivity ρ. For example, for $Co_{50}Fe_{50}$, ρ is approximately 10.6 μΩ-cm and M is approximately 1550 emu/cc.

The AP2 layer can also be a laminated structure to obtain a high degree of spin-dependent interface scattering. For example the AP2 layer can be a FM/XX/FM/ . . . /XX/FM laminate, where the ferromagnetic (FM) layers are formed of Co, Fe or Ni, one of their alloys, or a multilayer of these materials, such as a CoFe—NiFe—CoFe trilayer; and the XX layers are nonmagnetic layers, typically Cu, Ag, Si, Al, Ge, Ti, or Au or their alloys, and are thin enough that the adjacent FM layers are ferromagnetically coupled.

For an example where the free layer is a multilayer, the AP2 layer 120 may be a CoFe alloy, typically 10 to 30 Å thick, and the free ferromagnetic layer 110 may be a bilayer of a CoFe alloy, typically 10-15 Å thick and formed on the spacer layer 130, and a NiFe alloy, typically 10-30 Å thick, formed on the CoFe layer. The APC layer in the AP-pinned structure is typically Ru or Ir with a thickness between about 4-10 Å.

A hard magnetic layer (not shown), such as a CoPt or CoCrPt layer, may also be included outside the sensor stack near the side edges of the free ferromagnetic layer 110 or in the stack for magnetic stabilization or longitudinal biasing of the free ferromagnetic layer 110.

One or more of the free layer 110, the AP2 layer 120, the capping layer 112 and the conductive nonmagnetic spacer layer 130 may also include a nano-oxide layer (NOL) to locally confine the current path and increase the effective resistance of the active region. A CoFe NOL may be formed, for example, by interrupting the deposition after some CoFe has been deposited somewhere in the free layer, the AP2 layer, the capping layer, or the conductive spacer layer and oxidizing its surface for several minutes in an $O_2$ or $O_2$/Ar gas at 0.1-10 Torr. NOLs can be formed by oxidizing other materials, e.g., Cu/Al or Cu/Ti alloys or multilayers.

While the read head 100 shown in FIG. 4 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the spacer layer 130.

The present invention is the CPP-SV sensor essentially as described above, but wherein the AP2 layer is a multilayer of first and second sublayers, with the second AP2-2 sublayer being in contact with the spacer layer and formed of an alloy comprising Co, Fe and Si, wherein Si is present in the alloy in an amount between about 20 and 30 at. %, and wherein the ratio of Co to Fe in the alloy is between about 0.8 and 1.2. More particularly, the CoFeSi alloy may consist essentially of only Co, Fe and Si according to the formula $(Co_xFe_{(100-x)})_{(100-y)}Si_y$ where the subscripts represent at. %, x is between about 45 and 55, and y is between about 20 and 30. The first AP2-1 sublayer is in contact with the APC layer and contains no Si. Preferably the free ferromagnetic layer has substantially the same composition as the second AP2-2 sublayer.

Figure 5:
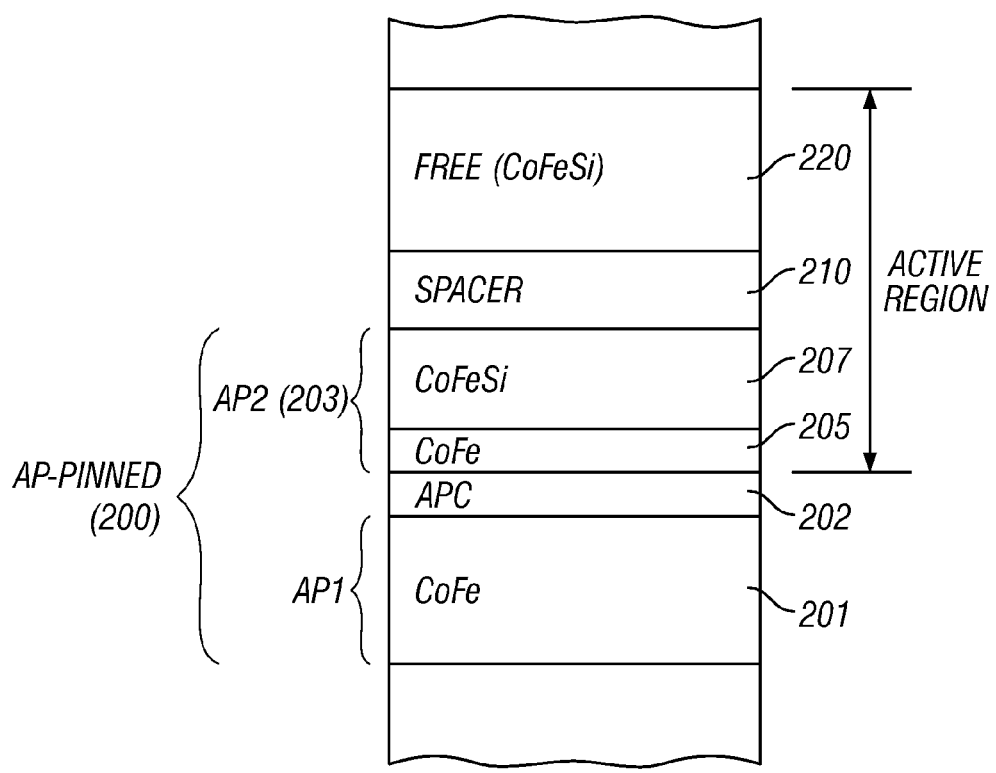
FIG. 5 is a cross-sectional schematic view of the AP-pinned structure of the present invention.

As illustrated in FIG. 5, in the CPP-SV sensor according to this invention the AP1 layer 201 is a crystalline ferromagnetic alloy of one or more of Co, Fe and Ni without Si and the AP2 layer 203 comprises a multilayer of a first AP2-1 sublayer 205 and a second AP2-2 sublayer 207. First AP2-1 sublayer 205 is located adjacent to the APC layer 202 of the AP-pinned layer structure 200 and is preferably a crystalline ferromagnetic alloy of one or more of Co, Fe and Ni without Si to facilitate a strong antiferromagnetic coupling. Sublayer 207 is the Si-containing layer according to this invention and is located adjacent the electrically conducting nonmagnetic spacer layer 210. It has been discovered that if the AP2 layer is a single Si-containing layer that is also in contact with the APC layer, antiferromagnetic coupling to the AP1 layer across the APC layer 202 is substantially reduced.

If the AP2 layer is a FM/XX/FM/ . . . /XX/FM laminate as described above then one or more of the FM layers may be formed of the above-described Si-containing alloy. However, the FM layer in contact with the APC layer would contain no Si.

The free layer 220 is located adjacent the spacer layer 210 and may also be formed of the Si-containing. Typical thicknesses for the layers shown in FIG. 5 are 15-40 Å for AP1, 3-9 Å for the APC, 4-15 Å for layer 205, 10-80 Å for layer 207, 25-100 Å for spacer layer 210 and 10-80 Å for free layer 220. The free layer 220 is shown in FIG. 5 as a single free layer comprising the Si-containing alloy. However, like the AP2 layer, the free layer 220 may be a multilayer (not shown in FIG. 5) comprising a first sublayer of the Si-containing alloy, and a second sublayer comprising a crystalline ferromagnetic alloy of one or more of Co, Fe and Ni without Si. If the free layer 220 is such a multilayer, then the Si-containing layer of the multilayer free layer should be located adjacent the spacer layer 210.

The addition of Si to ferromagnetic layers in CPP-SV sensors has been previously suggested. For example, in U.S. Pat. No. 6,905,780, a CoFeM alloy has been suggested for use as a single free layer and/or a single pinned layer, where M is selected from a large group of elements and is present in an amount between 0.1 and 30 at %. However, in the present invention it has been discovered that $(Co_xFe_{100-x})_{(100-y)}Si_y$ having a composition where x is between about 45 and 55 and y is between about 20 and 30 is needed for a substantial increase in magnetoresistance in a CPP-SV sensor. However, for this preferred composition range antiferromagnetic coupling through an antiparallel coupling (APC) layer like Ru is largely reduced and thermally unstable. Thus, the AP2 layer needs to be a multilayer comprising a first AP2-1 sublayer without Si located adjacent the APC layer, and a second AP2-2 sublayer having a composition comprising $(Co_xFe_{100-x})_{(100-y)}Si_y$ (where x is between about 45 and 55 and y is between about 20 and 30), with this second AP2-2 sublayer being located adjacent and in contact with the spacer layer. Preferably the free layer is also formed of the same Si-containing alloy. The magnetoresistance (ΔR/R) for a CPP structure with this Si-containing free layer and an AP-pinned layer with this Si-containing AP2 multilayer was measured at about 3.1%. By contrast, the magnetoresistance (ΔR/R) for a CPP structure with this Si-containing free layer and an AP-pinned layer without this Si-containing AP2 multilayer was measured at about 2.3%.

Figure 6:
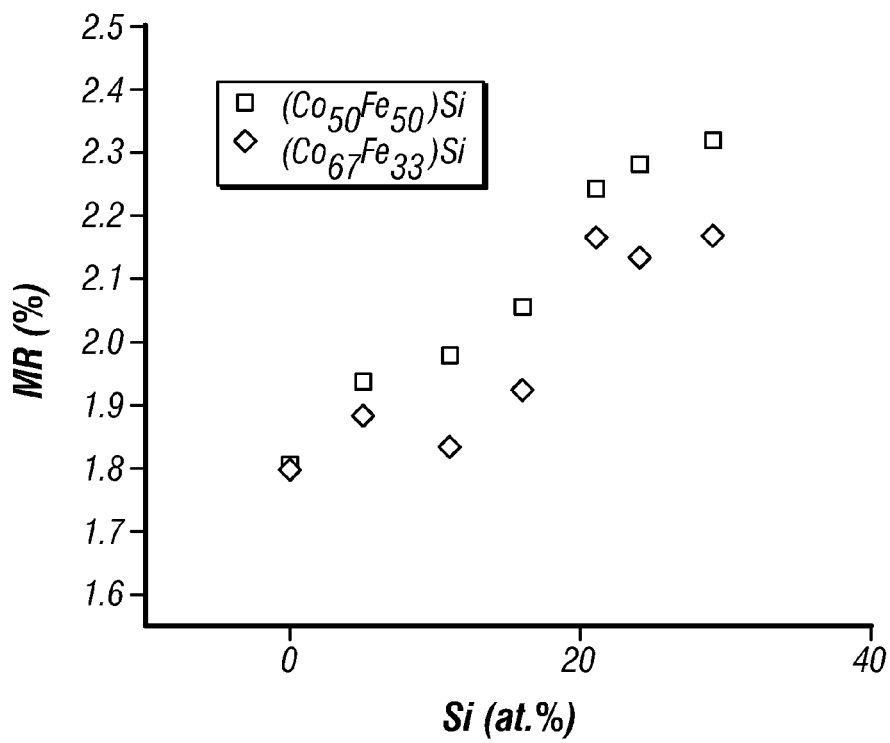
FIG. 6 is a graph of magnetoresistance as a function of Si content for two sets of CPP structures, one where the Co/Fe ratio CoFeSi free alloy was 2.0 and one where it was 1.0.

An important aspect of the invention is the Co/Fe ratio in the Si-containing AP2-2 sublayer and free layer. It should be close to 1.0, preferably between about 0.8 and 1.2. This is shown in FIG. 6 for a CPP structure with a Si-containing free layer and an AP-pinned layer (without Si in the AP2 layer). The Si percentage in the free layer was varied for two sets of Si-containing free layers: one where the Co/Fe ratio of the CoFeSi free alloy was 2.0 ($Co_{67}Fe_{33}$) and one where it was 110 ($Co_{50}Fe_{50}$). As shown by FIG. 6, a substantial increase in magnetoresistance (ΔR/R) occurs for a Co/Fe ratio of 1.0. However, this precise ratio is not required, and as long as the ratio is between about 0.8 and 1.2, corresponding approximately to a composition of $[Co_xFe_{(100-x)}]$ where x is between about 45 and 55, there is still an optimized magnetoresistance. The final Co/Fe ratio may be chosen to satisfy other magnetic properties such as coercivity and anisotropy.

The improvement in magnetoresistance with the addition of Si to the free layer and the AP2-2 sublayer, each of which is located on opposite sides of and in contact with the spacer layer, is believed due to an increase in the electrical resistivity of the ferromagnetic material, which is indicative of a shortening of the SDL. The resistivity is increased and the SDL is shortened due to the additional Si scattering sites introduced.

In addition to the requirement that the Co/Fe ratio be between about 0.8 and 1.2, the Si must be present in an amount between about 20 to 30 at. %. This is shown by FIG. 6. There is a significant improvement in magnetoresistance once the Si content gets above about 20 at. %. Above about 30 at. %, the Si dilutes the magnetic moment and the ferromagnetic layers would have to be made too thick for a practical CPP sensor.

The invention is also applicable to AP-pinned structures wherein the AP2 layer is a FM/XX/FM/ . . . /XX/FM laminate with at least one of the ferromagnetic (FM) layers being the Si-containing ferromagnetic layer. The XX layers are nonmagnetic layers, typically Cu, Ag, Si, Al, Ge, Ti, or Au or their alloys, and are thin enough that the adjacent Si-containing FM layers are ferromagnetically coupled. This laminated AP2 layer would have at least two FM layers and one XX layer.

The CPP-SV magnetoresistive sensor with the improved AP-pinned structure may also be a dual spin-valve sensor, like the dual spin-valve structure for use as a CIP-SV sensor described in U.S. Pat. No. 5,287,238. Referring to FIG. 4, such a sensor would have a second electrically conducting nonmagnetic spacer layer (like layer 130) formed on top of free layer 110 and a second pinned layer structure (with layers like 120, 123, 122 in reversed order) according to this invention on top of the second nonmagnetic spacer layer, i.e., the second AP2 layer would be a multilayer with the Si-containing sublayer in contact with the second spacer layer.

Figure 7:
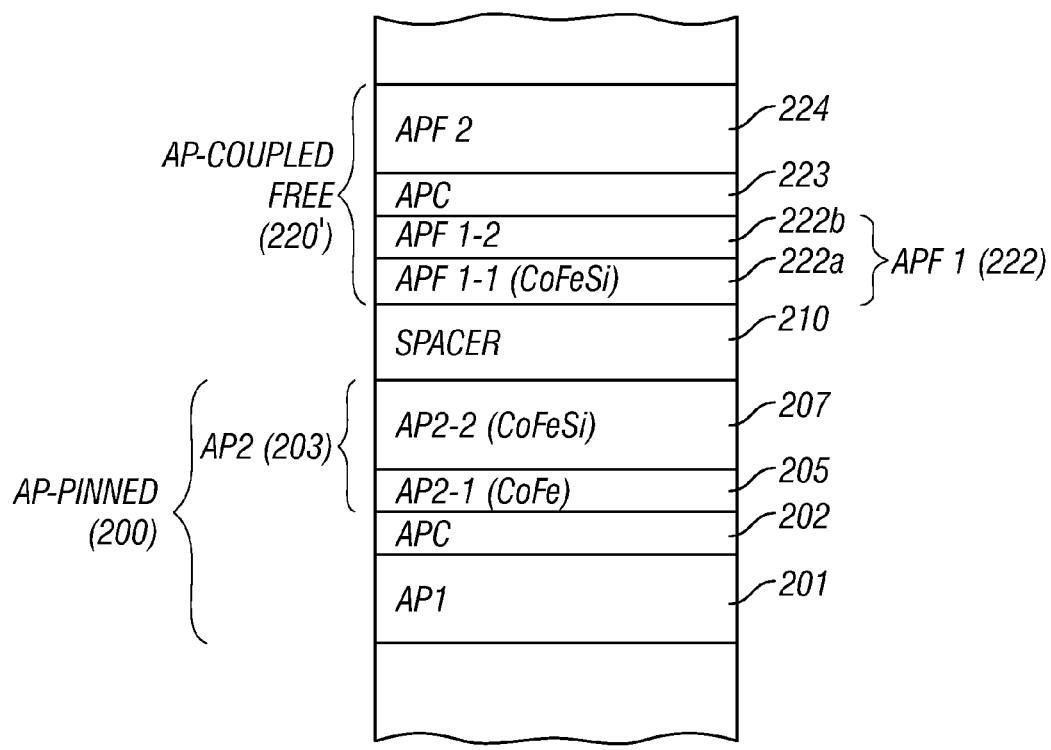
FIG. 7 is a cross-sectional schematic view of another embodiment of the CPP-SV sensor of the present invention sensor with an AP-pinned layer and an antiparallel-coupled free (APF) layer.

The CPP-SV magnetoresistive sensor may also comprise an antiparallel-coupled free (APF) layer. Such a sensor would have a second ferromagnetic free layer substantially antiparallel-coupled to first ferromagnetic free layer by use of an APC. In the case of a bottom-pinned sensor, the first ferromagnetic free layer is in contact with the spacer layer and the second ferromagnetic free layer is in contact with the cap, shield, or top-lead structure. FIG. 7 shows a sensor with the AP-pinned layer 200 and an antiparallel-coupled free layer 220'. The APF layer 220' includes first antiparallel free layer (APF1) 222 and second antiparallel free layer (APF2) 224 separated by APC layer 223. Such a CPP-SV sensor with an APF layer according to this invention would have at least the first free layer 222 formed of a Si-containing ferromagnetic alloy as described above. Also, APF1 222 is a multilayer, similar to the AP2 multilayer 203, in which case a first APF1 sublayer (APF1-1) 222a comprising the Si-containing alloy would be located adjacent spacer layer 210, and a second APF1 sublayer (APF1-2) 222b comprising a ferromagnetic alloy of one or more of Co, Fe and Ni without Si would be located above the first APF1-1 sublayer and in contact with the APC layer 223.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor capable of sensing external magnetic fields when a sense current is applied perpendicular to the planes of the layers in the sensor, the sensor comprising:
   a substrate;
   an antiparallel (AP) pinned structure on the substrate and comprising a first AP-pinned (AP1) ferromagnetic layer having an in-plane magnetization direction, a second AP-pinned (A2) ferromagnetic layer having an in-plane magnetization direction substantially antiparallel to the magnetization direction of the AP1 layer, the AP2 layer being a multilayer comprising a first AP2-1 sublayer and a second AP2-2 sublayer, and an AP coupling (APC) layer between and in contact with the AP1 layer and the first AP2-1 sublayer;
   a free ferromagnetic layer having an in-plane magnetization direction substantially free to rotate in the presence of an external magnetic field; and
   a spacer layer between and in contact with the free ferromagnetic layer and the second AP2-2 sublayer; wherein the second AP2-2 sublayer comprises a ferromagnetic alloy comprising Co, Fe and Si, wherein Si is present in the alloy in an amount greater than or equal to 20 atomic percent and less than or equal to 30 atomic percent and the ratio of Co to Fe in the alloy is between about 0.8 and 1.2; and wherein the first AP2-1 sublayer in contact with the APC layer contains no Si.

2. The sensor of claim 1 wherein said Si-containing alloy consists essentially of only Co, Fe and Si according to the formula $(Co_xFe_{(100-x)})_{(100-y)}Si_y$, where the subscripts represent atomic percent, x is between about 45 and 55, and y is greater than or equal to 20 and less than or equal to 30.

3. The sensor of claim 1 wherein the free ferromagnetic layer comprises said Si-containing alloy.

4. The sensor of claim 3 wherein the free ferromagnetic layer comprises an antiparallel-coupled free layer comprising a first free ferromagnetic layer (APF1) comprising said Si-containing alloy and having an in-plane magnetization direction, a second free ferromagnetic layer (APF2) having an in-plane magnetization direction substantially antiparallel to the magnetization direction of APF1, and an AP coupling (APC) layer between and in contact with the APF1 and APF2, said Si-containing APF1 being located adjacent the spacer layer.

5. The sensor of claim 4 wherein said Si-containing APF1 is a multilayer comprising a first APF 1-1 sublayer comprising said Si-containing alloy and in contact with the spacer layer, and a second APF1-2 sublayer having no Si.

6. The sensor of claim 1 wherein the AP-pinned structure is located between the substrate and the free ferromagnetic layer.

7. The sensor of claim 1 wherein the free ferromagnetic layer is located between the substrate and the AP-pinned structure.

8. The sensor of claim 1 wherein the AP-pinned structure is a self-pinned structure.

9. The sensor of claim 1 further comprising an antiferromagnetic layer exchange-coupled to the AP 1 layer for pinning the magnetization direction of the AP1 layer.

10. The sensor of claim 1 further comprising a hard magnetic layer in contact with the AP1 layer for pinning the magnetization direction of the AP1 layer.

11. The sensor of claim 1 wherein the sensor is a magnetoresistive read head for reading magnetically recorded data from tracks on a magnetic recording medium, and wherein the substrate is a first shield formed of magnetically permeable material.

12. The sensor of claim 1 wherein the sensor is a dual spin-valve sensor.

13. A current-perpendicular-to-the-plane magnetoresistive read head for reading magnetically recorded data from tracks on a magnetic recording medium, the head comprising:
a first shield layer of magnetically permeable material;
a seed layer on the first shield;
an antiparallel (AP) pinned structure on the seed layer and comprising a first AP-pinned (AP1) ferromagnetic layer on the seed layer and having an in-plane magnetization direction, a second AP-pinned (AP2) ferromagnetic layer having an in-plane magnetization direction substantially antiparallel to the magnetization direction of the AP1 layer, the AP2 layer being a multilayer comprising a first AP2-1 sublayer and a second AP2-2 sublayer, and an AP coupling (APC) layer between and in contact with the AP1 layer and the first AP2-1 sublayer;
a spacer layer on the second AP2-2 sublayer;
a free ferromagnetic layer on the spacer layer and having an in-plane magnetization direction oriented substantially orthogonal to the magnetization directions of the AP1 and AP2 layers in the absence of an external magnetic field;
wherein each of the free ferromagnetic layer and the second AP2-2 sublayer comprises a ferromagnetic alloy consisting essentially of only Co, Fe and Si according to the formula $(Co_xFe_{(100-x)})_{(100-y)}Si_y$, where the subscripts represent atomic percent, x is between 45 and 55, and y is between 20 and 30, and wherein the first AP2-1 sublayer in contact with the APC layer contains no Si;
a capping layer on the free ferromagnetic layer; and
a second shield layer of magnetically permeable material on the capping layer.

14. The head of claim 13 wherein the free ferromagnetic layer comprises a multilayer comprising a first layer comprising said Si-containing alloy and in contact with the spacer layer, and a second layer comprising a ferromagnetic alloy of one or more of Co, Fe and Ni without Si and in contact with the first free layer.

15. The head of claim 13 wherein the free ferromagnetic layer comprises an antiparallel-coupled free layer comprising a first free ferromagnetic layer (APF1) comprising said Si-containing alloy and having an in-plane magnetization direction, a second free ferromagnetic layer (APF2) having an in-plane magnetization direction substantially antiparallel to the magnetization direction of APF1, and an AP coupling (APC) layer between and in contact with the APF1 and APF2, said Si-containing APF1 being located adjacent the spacer layer.

16. The head of claim 15 wherein said Si-containing APF1 is a multilayer comprising a first APF1-1 sublayer comprising said Si-containing alloy and in contact with the spacer layer, and a second APF1-2 sublayer having no Si.

\* \* \* \* \*